(12) United States Patent
Patel et al.

(10) Patent No.: US 6,803,167 B2
(45) Date of Patent: Oct. 12, 2004

(54) PREPARATION OF LITHOGRAPHIC PRINTING PLATES

(75) Inventors: Jayanti Patel, Fort Collins, CO (US); Kevin B. Ray, Fort Collins, CO (US); Jianbing Huang, Trumbull, CT (US)

(73) Assignee: Kodak Polychrome Graphics, LLC, Norwalk (CN)

( * ) Notice: Subject to any disclaimer, the term of this patent is extended or adjusted under 35 U.S.C. 154(b) by 45 days.

(21) Appl. No.: 10/309,626

(22) Filed: Dec. 4, 2002

(65) Prior Publication Data

US 2004/0110090 A1 Jun. 10, 2004

(51) Int. Cl.$^7$ .............................. G03F 7/023; G03F 7/30
(52) U.S. Cl. ....................... 430/166; 430/190; 430/192; 430/193; 430/302; 430/331
(58) Field of Search ................................. 430/166, 190, 430/192, 193, 302, 331

(56) References Cited

U.S. PATENT DOCUMENTS

| | | | | |
|---|---|---|---|---|
| 4,123,279 A | * | 10/1978 | Kobayashi | 430/193 |
| 6,294,311 B1 | * | 9/2001 | Shimazu et al. | 430/271.1 |
| 6,352,811 B1 | | 3/2002 | Patel et al. | 430/270.1 |
| 6,352,812 B1 | | 3/2002 | Shimazu et al. | 430/273.1 |
| 6,358,669 B1 | | 3/2002 | Savariar-Hauck et al. | 430/273.1 |
| 6,528,228 B2 | * | 3/2003 | Hauck et al. | 430/166 |
| 2001/0044065 A1 | | 11/2001 | Savariar-Hauck et al. | 430/166 |

FOREIGN PATENT DOCUMENTS

| | | |
|---|---|---|
| EP | 0864420 | 9/1998 |
| EP | 0908307 | 4/1999 |
| EP | 0908779 | 4/1999 |
| EP | 0908784 | 4/1999 |
| EP | 0940266 | 9/1999 |
| EP | 0950518 | 10/1999 |
| EP | 0960728 | 12/1999 |
| EP | 1023994 | 8/2000 |
| EP | 0908305 | 11/2001 |

* cited by examiner

Primary Examiner—John S. Chu
(74) Attorney, Agent, or Firm—RatnerPrestia

(57) ABSTRACT

Processes for imaging and developing imageable elements useful as lithographic printing plate precursors either thermally or with ultraviolet radiation that use the same developer are disclosed. The imageable elements comprise a top layer and an underlayer. The top layer contains a phenolic polymer and a material that has either the o-benzoquinonediazide functionality or the o-diazonaphthoquinone functionality. The developer is a 20:80 to 80:20 mixture of (1) an aqueous alkaline developer that has a pH greater than 11 and contains about 2 wt % to about 8 wt % of an alkali metal silicate, and (2) a solvent based developer that contains about 0.5 wt % to about 15 wt % of an organic solvent or mixture of organic solvents.

29 Claims, No Drawings

PREPARATION OF LITHOGRAPHIC PRINTING PLATES

FIELD OF THE INVENTION

This invention relates to lithographic printing. In particular, this invention relates to methods for imaging imageable elements useful as lithographic printing plate precursors either thermally or with ultraviolet radiation and developing them in the same developer.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise a top layer applied over the surface of a hydrophilic substrate. The top layer includes one or more radiation-sensitive components, which may be dispersed in a suitable binder. Alternatively, the radiation-sensitive component can also be the binder material.

If after exposure to radiation, the imaged regions are removed in the developing process, revealing the underlying hydrophilic surface of the substrate, the plate is called a positive-working printing plate. Conversely, if the unimaged regions are removed by the developing process and the imaged regions remain, the plate is called a negative-working plate. In each instance, the regions of the radiation-sensitive layer (i.e., the image areas) that remain repel water and accept ink, and the regions of the hydrophilic surface revealed by the developing process accept water, typically a fountain solution.

Multi-layer positive-working imageable elements for the preparation of lithographic printing plates comprise at least two layers, an underlayer and a top layer, over a substrate with a hydrophilic surface. Two types of imaging are typically used. An element may imaged through a negative with ultraviolet radiation. Alternatively, an element may be imaged directly with an infrared laser, obviating the need for exposure through a negative.

To obtain a printing plate with imagewise distribution of printable regions, it is necessary to remove the imaged regions of the imageable element by contacting the imaged imageable element with a suitable developer. Ultraviolet imaging and thermal imaging require different types of imageable elements and different types of developers. Consequently, a user that uses both ultraviolet and thermal imaging must maintain an inventory of both types of imageable elements and must have two types of developers. Thus, a need exists for a method for forming printing plates using either ultraviolet or thermal imaging that requires only one type of imageable element and one type of developer.

SUMMARY OF THE INVENTION

The invention is a method of preparing images useful as lithographic printing plates using either ultraviolet or thermal imaging, in which the same imageable element and the same developer can be used regardless of the type imaging. The method comprises the steps of:

(a) imaging an imageable element either thermally or with ultraviolet radiation and producing an imaged imageable element comprising imaged and unimaged regions;

(b) developing the imaged imageable element with a developer and removing the imaged regions;

in which:

the imageable element comprises, in order:

a top layer;

an underlayer; and a substrate;

the underlayer comprises a first polymeric material;

the underlayer is soluble in or removable by the developer;

the top layer is ink receptive;

the top layer is insoluble in the developer prior to imaging;

the top layer comprises a phenolic polymer and a compound that comprises an o-benzoquinonediazide moiety or an o-diazonaphthoquinone moiety; a phenolic polymer that comprises the o-benzoquinonediazide moiety or the o-diazonaphthoquinone moiety; or a mixture thereof; and the developer is an about 20:80 to about 80:20 mixture of:

(1) an aqueous alkaline developer that has a pH greater than 11 and comprises about 2 wt % to about 8 wt % of an alkali metal silicate, based on the weight of the aqueous alkaline developer, and (2) a solvent based developer that comprises about 0.5 wt % to about 15 wt % of an organic solvent or mixture of organic solvents, based on the weight of the solvent based developer.

The resulting imaged and developed imageable elements are useful as lithographic printing plates.

DETAILED DESCRIPTION OF THE INVENTION

Unless the context indicates otherwise, in the specification and claims, the terms first polymeric material, phenolic polymer, organic solvent, photothermal conversion material, and similar terms include mixtures of such materials. Unless otherwise specified, all percentages are percentages by weight. "Thermal imaging" refers to imaging either by infrared radiation or with a hot body, such as with a thermal head or an array of thermal heads. "Ultraviolet imaging" refers to imaging with ultraviolet radiation, either by exposure through a photomask or with an ultraviolet laser.

Imageable Element

The imageable element comprises a substrate, an underlayer, and a top layer. Optionally, a barrier layer and/or an absorber layer may be between the underlayer and the top layer. The element may also comprise a photothermal conversion material, which may be in the top layer, the underlayer and/or the absorber layer.

Substrate

The substrate has at least one hydrophilic surface. It comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 μm to about 600 μm. Typically, the substrate comprises an interlayer between the aluminum support and the top layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

The back side of the substrate (i.e., the side opposite the underlayer and top layer) may be coated with an antistatic agent and/or a slipping layer or matte layer to improve handling and "feel" of the imageable element.

Underlayer

The underlayer is between the hydrophilic surface of the substrate and the top layer. After imaging, it is removed by the developer to expose the underlying hydrophilic surface of the substrate. It is preferably soluble in the alkaline developer to prevent sludging of the developer.

The underlayer comprises a first polymeric material. The first polymeric material is preferably soluble in an alkaline developer. In addition, the first polymeric material is preferably insoluble in the solvent used to coat the top layer so that the top layer can be coated over the underlayer without dissolving the underlayer.

Polymeric materials useful as the first polymeric material include those that contain an acid and/or phenolic functionality, and mixtures of such materials. Useful polymeric materials include carboxy functional acrylics, vinyl acetate/-crotonate/vinyl neodecanoate copolymers, styrene maleic anhydride copolymers, phenolic resins, maleated wood rosin, and combinations thereof. Underlayers that provide resistance both to fountain solution and aggressive washes are disclosed in Shimazu, U.S. Pat. No. 6,294,311, incorporated herein by reference.

Particularly useful polymeric materials are copolymers that comprise N-substituted maleimides, especially N-phenylmaleimide; polyvinylacetals; methacrylamides, especially methacrylamide; and acrylic and/or methacrylic acid, especially methacrylic acid. More preferably, two functional groups are present in the polymeric material, and most preferably, all three functional groups are present in the polymeric material. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid.

These polymeric materials are soluble in alkaline developers. In addition, they are soluble in a methyl lactate/methanol/dioxolane (15:42.5:42.5 wt %) mixture, which can be used as the coating solvent for the underlayer. However, they are poorly soluble in solvents such as acetone and toluene, which can be used as solvents to coat the top layer on top of the underlayer without dissolving the underlayer. These polymeric materials are typically resistant to washes with 80 wt % diacetone alcohol/20 wt % water.

Another group of preferred polymeric materials for the first polymeric material are alkaline developer soluble copolymers that comprise a monomer that has a urea bond in its side chain (i.e., a pendent urea group), such as are disclosed in Ishizuka, U.S. Pat. No. 5,731,127. These copolymers comprise about 10 to 80 wt %, preferably about 20 to 80 wt %, of one or more monomers represented by the general formula:

$$CH_2=C(R)-CO_2-X-NH-CO-NH-Y-Z,$$

in which R is —H or —$CH_3$; X is a bivalent linking group; Y is a substituted or unsubstituted bivalent aromatic group; and Z is —OH, —COOH, or —$SO_2NH_2$.

R is preferably —$CH_3$. Preferably X is a substituted or unsubstituted alkylene group, substituted or unsubstituted phenylene [—$(C_6H_4)$—] group, or substituted or unsubstituted naphthalene [—$(C_{10}H_6)$—] group; such as —$(CH_2)_n$—, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is —$(CH_2CH_2)$—. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is —OH, —COOH, or —$SO_2NH_2$, preferably —OH. A preferred monomer is:

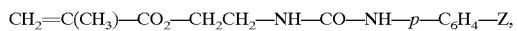
$$CH_2=C(CH_3)-CO_2-CH_2CH_2-NH-CO-NH-p-C_6H_4-Z,$$

in which Z is —OH, —COOH, or —$SO_2NH_2$, preferably —OH.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide. These polymeric materials are typically resistant to washes with 80 wt % 2-butoxyethanol/20 wt % water.

The polymeric materials described above are soluble in alkaline developers. In addition, they are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the top layer over the underlayer without dissolving the underlayer.

Both these groups of polymeric materials can be prepared by methods, such as free radical polymerization, well known to those skilled in the art. Synthesis of copolymers that have urea bonds in their side chains is disclosed, for example, in Ishizuka, U.S. Pat. No. 5,731,127.

Other alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Another group of polymeric materials that are useful in the underlayer include alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)methacrylamide, N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838. Particularly useful polymeric materials comprise (1) the sulfonamide monomer unit, especially N-(p-aminosulfonylphenyl)methacrylamide; (2) acrylonitrile and/or methacrylonitrile; and (3) methyl methacrylate and/or methyl acrylate. These polymeric materials are typically resistant to washes with 80 wt % 2-butoxyethanol/20 wt % water.

Combinations of alkaline developer soluble polymeric materials may be used in the underlayer to provide improved chemical resistance, i.e., resistance to both fountain solution and to aggressive washes. A combination of a polymeric material that is resistant to 80 wt % diacetone alcohol/20 wt % water, which tests resistance to a UV wash, with a polymeric material that is resistant to 80 wt % 2-butoxyethanol/20 wt % water, which tests resistance to alcohol sub fountain solution, surprisingly produces a layer that shows good resistance to both solvent mixtures. Preferably, one polymeric material has a one-minute soak loss of less than about 20%, more preferably less than about 10%, and most preferably less than about 5% in 80 wt % diacetone alcohol/20 wt % water, and the other polymeric material has a one-minute soak loss of less than about 20%, and more preferably less than about 10%, in 80 wt % 2-butoxyethanol/20 wt % water. One-minute soak loss is measured by coating a layer of the polymeric material on a substrate, typically at a coating weight of about 1.5 g/m$^2$, soaking the coated substrate in the appropriate solvent for one minute at room temperature, drying the coated substrate, and measuring the weight loss as a percent of the total weight of polymeric material present on the substrate.

Combination of (1) a copolymer that comprises N-substituted maleimides, especially N-phenylmaleimide; methacrylamides, especially methacrylamide; and acrylic and/or methacrylic acid, especially methacrylic acid with (2) an alkaline soluble copolymer that comprises a urea in its side chain or with an alkaline soluble copolymer that comprises 10 to 90 mol % of a sulfonamide monomer unit, especially one that comprises N-(p-aminosulfonylphenyl)methacrylamide, N-(m-aminosulfonylphenyl)methacrylamide, N-(o-aminosulfonylphenyl)methacrylamide, and/or the corresponding acrylamide, is especially advantageous. One or more other polymeric materials, such as novolac resins, may also be present in the combination. Preferred other polymeric materials, when present, are novolac resins.

When a combination of polymeric materials is used, the underlayer typically comprises about 10% to about 90% by weight of the polymeric material that is resistant to 80 wt % diacetone alcohol/20 wt % water, and about 10% to about 90% by weight of the polymeric material that is resistant to 80 wt % 2-butoxyethanol/20 wt % water, based on the total weight of these polymeric materials in the underlayer. Preferably the underlayer comprises about 40% to about 85% by weight of the polymeric material that is resistant to 80 wt % diacetone alcohol/20 wt % water and about 15% to about 60% of the polymeric material that is resistant to 80 wt % 2-butoxyethanol/20 wt % water, based on the total weight of these two polymeric materials in the underlayer. These materials together typically comprise at least about 50 wt %, preferably at least about 60 wt %, and more preferably at least about 65 wt %, of the underlayer, based on total weight of the materials in the underlayer. When present, up to about 20 wt %, preferably about 1 to about 20 wt %, other polymeric materials may be present in the underlayer, based on the total amount of all the polymeric materials in the underlayer.

Photothermal Conversion Material

The imageable element may comprise a photothermal conversion material. When present, the photothermal conversion material may be present in the top layer, the underlayer, a separate absorber layer, or a combination thereof. To minimize ablation of the top layer during imaging with an infrared laser, the photothermal conversion material is preferably in the underlayer and/or a separate absorber layer, and the top layer is preferably substantially free of photothermal conversion material. That is, the photothermal conversion material in the top layer, if any, should absorb less than about 10% of the imaging radiation, and the amount of imaging radiation absorbed by the top layer, if any, is not enough to cause ablation of the top layer.

Photothermal conversion materials absorb radiation and convert it to heat. Photothermal conversion materials may absorb ultraviolet, visible, and/or infrared radiation and convert it to heat. Although the novolac resin may comprise an absorbing moiety, i.e., be a photothermal conversion material, typically the photothermal conversion material is a separate compound.

The photothermal conversion material may be either a dye or pigment, such as a dye or pigment of the squarylium, merocyanine, indolizine, pyrilium, cyanine, or metal diothiolene class. Examples of absorbing pigments are Projet 900, Projet 860 and Projet 830 (all available from the Zeneca Corporation), and carbon black. Dyes, especially dyes with a high extinction coefficient in the range of 750 nm to 1200 nm, are preferred. Absorbing dyes are disclosed in numerous publications, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful dyes include: 2-(2-(2- phenylthio-3-((1,3-dihydro-1,3,3 trimethyl-2H-indol-2-ylidene)ethylidene)-1-cyclohexen-1-yl) ethenyl)-1,3,3-trimethyl-3H indolium chloride; 2-(2-(2-phenylsulfonyl-3-(2-(1,3-dimethyl-1,3,3-trimethyl-2H-indol-2-ylidene)-ethylidene)-1-cyclohexen-1-yl)-ethenyl)-1,3,3-trimethyl-3H-indolium chloride; 2-(2-(2-thiophenyl-3-(2-(1,3-dihydro-1,3,3-trimethyl-2H-indol-2-ylidene)-ethylidene)-1-cyclohexen-1-yl)-ethenyl)-1,3,3-trimethyl-3H-indolium chloride; 2-(2-(2-thiophenyl-3-(2-(1,3-dihydro-1,3,3-trimethyl-2H-indol-2-ylidene)-ethylidene)-1-cyclopenten-1-yl)-ethenyl)-1,3,3-trimethyl-3H-indolium tosylate; 2-(2-(2-chloro-3-(2-ethyl-(3H-benzthiazole-2-ylidene)-ethylidene)-1-cyclohexen-1-yl)-ethenyl)-3-ethyl-benzthiazolium tosylate; and 2-(2-(2-chloro-3-(2-(1,3-dihydro-1,3,3-trimethyl-2H-indol-2-ylidene)-ethylidene)-1-cyclohexen-1-yl)-ethenyl)-1,3,3-trimethyl-3H-indolium tosylate. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), and IR Dye A and IR Dye B, whose structures are shown below.

IR Dye A

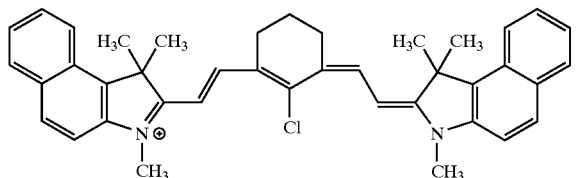

IR Dye B

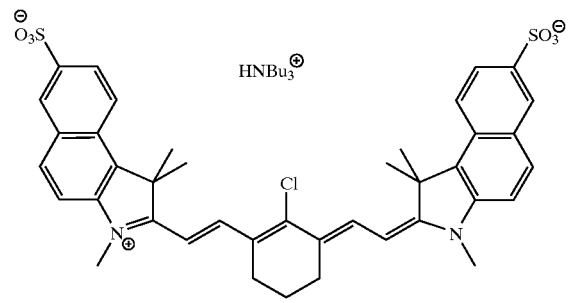

The amount of photothermal conversion material in the element is generally sufficient to provide an optical density of at least 0.05, and preferably, an optical density of from about 0.5 to about 2 at the imaging wavelength. The amount of an absorber required to produce a particular optical density can be determined from the thickness of the layer and the extinction coefficient of the absorber at the wavelength used for imaging using Beers law. Although elements that comprise a photothermal conversion material may be imaged with a thermal head, it is not necessary that the element comprise a photothermal conversion material when imaging is to be carried out with a thermal head.

Top Layer

The top layer is ink receptive and protects the underlying layer or layers from the developer. It is insoluble in the developer prior to imaging. However, imaged regions of the top layer are removable by the developer after imaging. This allows the developer to penetrate the top layer, the absorber layer or barrier layer, if present, and the underlayer, and remove these layers in the imaged regions, revealing the underlying hydrophilic surface of the hydrophilic substrate.

The top layer comprises a second polymeric material. Polymers that contain phenolic hydroxyl groups, i.e., phenolic resins, are preferred second polymeric materials for these top layers. Preferably, the polymeric material is a light-stable, water-insoluble, aqueous alkaline developer-soluble, film-forming polymeric material that has a multiplicity of phenolic hydroxyl groups, either on the polymer backbone or on pendant groups. Novolac resins, resol resins, acrylic resins that contain pendent phenol groups, and polyvinyl phenol resins are preferred phenolic resins.

The second polymeric material is preferably a novolac resin, a functionalized novolac resin, or a mixture thereof. Novolac resins are typically prepared by condensation of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. One of two processes, the solvent condensation process and the hot melt condensation process, is typically used. Typical novolac resins include, for example, phenol-formaldehyde resins, cresol-formaldehyde resins, phenol-cresol-formaldehyde resins, p-t-butylphenol-formaldehyde resins, and pyrogallol-acetone resins.

The novolac resin is preferably solvent soluble, that is preferably sufficiently soluble in a coating solvent to produce a coating solution that can be coated to produce a top layer. Common coating solvents include, for example, acetone, tetrahydrofuran, and 1-methoxypropan-2-ol. In one aspect, the second polymeric material may be selected from: solvent soluble novolac resins that have a weight average molecular weight of at least 10,000; solvent soluble novolac resins that have a weight average molecular weight of at least 10,000, functionalized with polar groups; solvent soluble m-cresol/p-cresol novolac resins that comprise at least 10 mol % p-cresol and have a weight average molecular weight of at least 8,000; solvent soluble m-cresol/p-cresol novolac resins that comprise at least 10 mol % p-cresol and have a weight average molecular weight of at least 8,000, functionalized with groups that contain the o-benzoquinonediazide or o-diazonaphthoquinone moiety; and mixtures thereof. In one aspect, the novolac resins are prepared by solvent condensation.

The top layer comprises a compound that contains an o-benzoquinonediazide or an o-diazonaphthoquinone moiety. Compounds that contain the benzoquinonediazide moiety or the o-diazonaphthoquinone moiety (i.e., quinonediazides), preferably compounds that comprise the moiety attached to a ballasting moiety that has a molecular weight of at least 1500, but less than about 5000, are preferred. Typically, these compounds are prepared by the reaction of either a 1,2-benzoquinone diazide having a halogenosulfonyl group, typically a sulfonylchloride group, at the 4-position, or a 1,2-naphthoquinone diazide having a halogenosulfonyl group, typically a sulfonylchloride group, at the 4- or 5-position with a mono- or poly-hydroxyphenyl compound, such as mono- or poly-hydroxy benzophenone. Preferred reactive compounds are the sulfonyl chloride or esters; the sulfonyl chlorides are most preferred.

Useful compounds include, but are not limited to: 2,4-bis (2-diazo-1,2-dihydro-1-oxo-5-naphthalenesulfonyloxy) benzophenone; 2-diazo-1,2-dihydro-1-oxo-5- naphthalenesulfonyloxy-2,2-bishydroxyphenylpropane monoester; the hexahydroxybenzophenone hexaester of 2-diazo-1,2-dihydro-1-oxo-5-naphthalenesulfonic acid; 2,2'-bis(2-diazo-1,2-dihydro-1-oxo-5-naphthalenesulfonyloxy)-biphenyl; 2,2',4,4'-tetrakis(2-diazo-1,2-dihydro-1-oxo-5-naphthalenesulfonyloxy) biphenyl; 2,3,4-tris(2-diazo-1,2-dihydro-1-oxo-5-naphthalenesulfonyloxy)benzophenone; 2,4-bis(2-diazo-1,2-dihydro-1-oxo-4-naphthalenesulfonyloxy)benzophenone; 2-diazo-1,2-dihydro-1-oxo-4-naphthalenesulfonyloxy-2,2-bishydroxyphenylpropane monoester; the hexahydroxybenzophenone hexaester of 2-diazo-1,2-dihydro-1-oxo-4-naphthalenesulfonic acid; 2,2'-bis(2-diazo-1,2-dihydro-1-oxo-4-naphthalenesulfonyloxy)biphenyl; 2,2',4,4'-tetrakis (2-diazo-1,2-dihydro-1-oxo-4-naphthalenesulfonyloxy) biphenyl; 2,3,4-tris(2-diazo-1,2-dihydro-1-oxo-4-naphthalenesulfonyloxy)benzophenone; and others known in the art, for example, those described in Mizutani, U.S. Pat. No. 5,143,816. When the compound that contains the o-benzoquinonediazide or the o-diazonaphthoquinone moiety is not a derivitized resin, it typically comprises about 0.5 wt % to about 30 wt %, preferably about 1 wt % to 15 wt %, based on the total dry composition weight of the layer.

Alternatively, the phenolic resin may be derivatized with a diazoquinone moiety. Polymeric diazonaphthoquinone compounds include derivatized resins formed by the reaction of a phenolic polymer, such as a novolac resin, and a reactive derivative that contains the diazonaphthoquinone moiety. Representative reactive derivatives include sulfonic and carboxylic acid, ester, or amide derivatives of the o-diazonaphthoquinone moiety.

Derivatization of novolac resins with compounds that contain the diazoquinone moiety is well known in the art and is described, for example, in West, U.S. Pat. Nos. 5,705,308, and 5,705,322, and in Chapter 5 of *Photoreactive Polymers: the Science and Technology of Resists*, A. Reiser, Wiley, New York, 1989, pp. 178–225. Representative reactive derivatives include sulfonic and carboxylic acid compounds that comprise the diazonaphthoquinone moiety and their esters, amides, and acid halides. Preferred compounds are the sulfonyl chlorides and esters. Most preferred are sulfonyl chlorides, such as 2-diazo-1,2-dihydro-1-oxo-5-naphthalenesulfonyl chloride; and 2-diazo-1,2-dihydro-1-oxo-4-naphthalenesulfonyl chloride.

Derivitazation of the hydroxyl groups of the phenolic polymer increases its molecular weight and reduces the number of hydroxyl groups, typically reducing both the solubility and the rate of dissolution of the polymer in the developer. Although the degree of derivitazation required will depend on the nature of the phenol polymer resin and the nature of the moiety introduced into the phenolic polymer, typically the ratio of quinonediazide groups to hydroxyl groups will be in the range of 1:100 to 1:2, more typically in the range of 1:50 to 1:3, even more typically in the range of 1:20 to 1:6.

The top layer may comprise a dye to aid in the visual inspection of the exposed and/or developed element. Print-out dyes distinguish the exposed regions from the unexposed regions during processing. Contrast dyes distinguish the unimaged regions from the imaged regions in the developed imageable element. Preferably, the dye does not absorb the imaging radiation. Triarylmethane dyes, such as ethyl violet, crystal violet, malachite green, brilliant green, Victoria blue B, Victoria blue R, and Victoria pure blue BO, may act as a contrast dye.

Other Layers

Other layers may be present in the imageable elements. When present, an absorber layer is between the top layer and the underlayer. The absorber layer consists essentially of the photothermal conversion material or a mixture of photothermal conversion materials and, optionally, a surfactant, such as a polyethoxylated dimethylpolysiloxane copolymer, or a mixture of surfactants. In particular, the absorber layer is substantially free of the first polymeric material. The surfactant may be present to help disperse the photothermal conversion material in a coating solvent.

The thickness of the absorber layer is generally sufficient to absorb at least 90%, preferably at least 99%, of the imaging radiation. The amount of absorber required to absorb a particular amount of radiation can be determined from the thickness of the absorber layer and the extinction coefficient of the absorber at the imaging wavelength using Beers law. Typically, the absorber layer has a coating weight of about 0.02 g/m$^2$ to about 2 g/m$^2$, preferably about 0.05 g/m$^2$ to about 1.5 g/m$^2$.

To minimize migration of the photothermal conversion material from the underlayer to the top layer during manufacture and storage of the imageable element, the element may comprise a barrier layer between the underlayer and the top layer. The barrier layer comprises a polymeric material that is soluble in the developer. If this polymeric material is different from the first polymeric material, it is preferably soluble in at least one organic solvent in which the first polymeric material is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer.

The first polymeric material and the polymeric material in the barrier layer may be the same polymeric material. When the barrier layer and the underlayer comprise the same polymeric material, the barrier layer should be at least half the thickness of the underlayer and more preferably as thick as the underlayer.

Preparation of the Imageable Element

The imageable element may be prepared by sequentially applying the underlayer over the hydrophilic surface of the substrate; applying the absorber layer or the barrier layer, if present, over the underlayer; and then applying the top layer using conventional techniques.

The terms "solvent" and "coating solvent" include mixtures of solvents. These terms are used although some or all of the materials may be suspended or dispersed in the solvent rather than in solution. Selection of coating solvents depends on the nature of the components present in the various layers.

The underlayer may be applied over the hydrophilic surface by any conventional method, such as coating or lamination. Typically the ingredients are dispersed or dissolved in a suitable coating solvent, and the resulting mixture coated by conventional methods, such as spin coating, bar coating, gravure coating, die coating, or roller coating.

If present, the absorber layer may be applied over the underlayer, typically to the surface of the underlayer, by any conventional method, such as those listed above. To prevent the underlayer from dissolving and mixing with the absorber layer when the absorber layer is coated over the underlayer, the absorber layer is preferably coated from a solvent in which the first polymeric material is essentially insoluble. Thus, if the photothermal conversion material is a dye, the coating solvent for the absorber layer should be a solvent in which the photothermal conversion material is sufficiently soluble that the absorber layer can be formed and the components of the underlayer are essentially insoluble. If the photothermal conversion material is a pigment, a dispersion of the pigment in a solvent such as water in which the components of the underlayer are essentially insoluble may be coated over the underlayer to form the absorber layer. If the photothermal conversion material is a sublimable dye, the absorber layer may be deposited by sublimation of the photothermal conversion material onto the underlayer.

The top layer is applied over the underlayer or, if present, over the absorber layer or barrier layer. To prevent these layers from dissolving and mixing with the top layer when the top layer is coated, the top layer should be coated from a solvent in which these layers are essentially insoluble. Thus, the coating solvent for the top layer should be a solvent in which the components of the top layer are sufficiently soluble that the top layer can be formed and in which the materials in the other layers are essentially insoluble. Typically the materials in these layers are soluble in more polar solvents and insoluble in less polar solvents so that the solvent or solvents used to coat these layers is more polar than the solvent used to coat the top layer. Consequently, the top layer can typically be coated from a conventional organic solvent such as toluene or 2-butanone. An intermediate drying step, i.e., drying the underlayer or, if present, the absorber layer, to remove coating solvent before coating the top layer over it, may also be used to prevent mixing of the layers. Alternatively, the underlayer, the top layer or both layers may be applied by conventional extrusion coating methods from a melt mixture of layer components. Typically, such a melt mixture contains no volatile organic solvents.

Imaging and Processing

Imaging may be carried out by well-known methods. The imageable element may be imaged using ultraviolet radiation. Conventional ultraviolet sources include, for example, carbon arc lamps, mercury lamps, xenon lamps, tungsten lamps, and metal halide lamps. Imaging with these light sources is typically carried out by exposure through a photomask. Diazonaphthoquinone compounds substituted in the 5-position typically absorb at 345 nm and 400 nm. Diazonaphthoquinone compounds substituted in the 4-position typically absorb at 310 nm and 380 nm. Direct digital imaging, which obviates the need for exposure through a photomask, may be carried out with ultraviolet lasers.

Thermal direct digital imaging may be carried out by well-known methods. The element may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the Creo Trendsetter (CREO, British Columbia, Canada) and the Gerber Crescent 42T (Gerber). Alternatively, the imageable element may be imaged using a hot body, such as a conventional apparatus containing a thermal printing head. A suitable apparatus includes at least one thermal head but would usually include a thermal head array, such as a TDK Model No. LV5416 used in thermal fax machines and sublimation printers or the GS618–400 thermal plotter (Oyo Instruments, Houston, Tex., USA).

Imaging produces an imaged element, which comprises a latent image of imaged and unimaged regions. Development of the imaged element to form an image, converts the latent image to an image by removing the imaged regions, revealing the hydrophilic surface of the underlying substrate.

The developer penetrates and removes the imaged regions of the top layer and of any other layers present in the element without substantially affecting the complimentary unimaged regions. While not being bound by any theory or explanation, it is believed that image discrimination is based on a kinetic effect. The imaged regions of the top layer are removed more rapidly in the developer than the unimaged regions. Development is carried out for a long enough time to remove the imaged regions of the top layer, the underlying regions of the other layer or layers of the element, but not long enough to remove the unimaged regions of the top layer. Hence, the top layer is described as being "insoluble" in the developer prior to imaging, and the imaged regions are described as being "soluble" in or "removable" by the developer because they are removed, and dissolved and/or dispersed, more rapidly in the developer than the unimaged regions. Typically, the underlayer is dissolved in the developer and the top layer is dispersed in the developer.

Common components of developers are surfactants; chelating agents, such as salts of ethylenediamine tetraacetic acid; organic solvents such as benzyl alcohol and phenoxyethanol; and alkaline components such as inorganic metasilicates, organic metasilicates, hydroxides or bicarbonates. Typical surfactants are: alkali metal salts of alkyl naphthalene sulfonates; alkali metal salts of the sulfate monoesters of aliphatic alcohols, typically having six to nine carbon atoms; and alkali metal sulfonates, typically having six to nine carbon atoms. A developer may also comprise a buffer system to keep the pH relatively constant. Numerous buffer systems are known to those skilled in the art. Typically buffer systems include, for example: combinations of water-soluble amines, such as mono-ethanol amine, diethanol amine, tri-ethanol amine, or tri-iso-propyl amine, with a sulfonic acid, such as benzene sulfonic acid or 4-toluene sulfonic acid; mixtures of the tetra sodium salt of ethylene diamine tetracetic acid (EDTA) and EDTA; mixtures of phosphate salts, such as mixtures of mono-alkali phosphate salts with tri-alkali phosphate salts; and mixtures of alkali borates and boric acid. Water typically comprises the balance of the developer.

An advantage of the invention is that the same developer can be used for imageable elements that have been thermally imaged, either with a hot body or with infrared radiation, and for elements that have been imaged with ultraviolet radiation. Imageable elements imaged with ultraviolet radiation and thermally imaged imageable elements can be developed in a developer consisting of a mixture of a high pH developer and a solvent based developer. High pH developers are typically used for positive working imageable elements, and solvent based developers are typically used for negative working imageable elements.

A high pH developer typically has a pH of at least about 11, more typically at least about 12, preferably from about 12 to about 14. High pH developers useful in the method of the invention comprise at least one alkali metal silicate, such as lithium silicate, sodium silicate, and/or potassium silicate. Sodium silicate and potassium silicate are preferred, and potassium silicate is most preferred. A mixture of alkali metal silicates may be used if desired. Especially preferred high pH developers comprise an alkali metal silicate having a $SiO_2$ to $M_2O$ weight ratio of at least of at least about 0.3, in which M is the alkali metal. Preferably, the ratio is from about 0.3 to about 1.2. More preferably, it is from about 0.6 to about 1.1, and most preferably, it is from about 0.7 to about 1.0.

The amount of alkali metal silicate in the high pH developer is typically at least 20 g of $SiO_2$ per 1000 g of developer (that is, at least about 2 wt %) and preferably about 20 g to 80 g of $SiO_2$ per 1000 g of developer (that is, about 2 wt % to about 8 wt %). More preferably, it is about 40 g to 65 g of $SiO_2$ per 1000 g of developer (that is, about 4 wt % to about 6.5 wt %).

Various commercial sources of suitable silicates are known. In addition to the alkali metal silicate, alkalinity can be provided by a suitable concentration of any suitable base, such as, for example, ammonium hydroxide, sodium hydroxide, lithium hydroxide, and/or potassium hydroxide. A preferred base is potassium hydroxide. Optional components of high pH developers are anionic, nonionic and amphoteric surfactants (up to 3% on the total composition weight), biocides (antimicrobial or antifungal agent), antifoaming agents or chelating agents (such as alkali gluconates), and thickening agents (water soluble or water dispersible polyhydroxy compound such as glycerin or polyethylene glycol). However, these developers typically do not contain organic solvents. Typical commercially available high pH developers include: Goldstar™ Developer, 4030 Developer, PD-1 Developer, and MX Developer, all available from Kodak Polychrome Graphics, Norwalk, Conn.

Solvent based alkaline developers comprise an organic solvent or a mixture of organic solvents. The developer is a single phase. Consequently, the organic solvent or mixture of organic solvents must be either miscible with water or sufficiently soluble in the developer that phase separation does not occur. The following solvents and mixtures thereof are suitable for use in the developer: the reaction products of phenol with ethylene oxide and propylene oxide, such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethoxyethanol and 2-butoxyethanol. A single organic solvent or a mixture of organic solvents can be used. The organic solvent is typically present in the developer at a concentration of between about 0.5 wt % to about 15 wt %, based on the weight of the developer, preferably between about 3 wt % and about 5 wt %, based on the weight of the developer. Typical commercially available solvent based developers include 956 Developer, and 955 Developer, available from Kodak Polychrome Graphics, Norwalk, Conn.

The developers are mixed in a ratio of about 20:80 to about 80:20, preferably about 30:70 to about 70:30; more preferably about 40:60 to about 60:40, and even more preferably about 50:50. Commercially available developers are sometimes supplied as concentrates. These ratios refer to the developer as it is normally used to process imaged imageable elements, not to the concentrate.

The developer is typically applied to the imaged precursor by spraying the element with sufficient force to remove the imaged regions. Alternatively, development may carried out in a processor equipped with an immersion-type developing bath, a section for rinsing with water, a gumming section, a drying section, and a conductivity-measuring unit, or the imaged precursor may be brushed with the developer. In each instance, a printing plate is produced. Development may conveniently be carried out in a commercially available spray-on processor, such as an 85 NS (Kodak Polychrome Graphics).

Following development, the printing plate is rinsed with water and dried. Drying may be conveniently carried out by infrared radiators or with hot air. After drying, the printing plate may be treated with a gumming solution. A gumming solution comprises one or more water-soluble polymers, for example polyvinylalcohol, polymethacrylic acid, polymethacrylamide, polyhydroxyethyl-methacrylate, polyvinylmethylether, gelatin, and polysaccharide such as dextran, pullulan, cellulose, gum arabic, and alginic acid. A preferred material is gum arabic.

A developed and gummed plate may also be baked to increase the run length of the plate. Baking can be carried out, for example at about 220° C. to about 240° C. for about 7 to 10 minutes, or at a temperature of 120° C. for 30 min.

Once the imageable element has been imaged and developed, printing can then be carried out by applying a fountain solution and then a lithographic ink to the image on its surface. The fountain solution is taken up by the imaged regions, i.e., the surface of the hydrophilic substrate revealed by imaging and development process, and the ink is taken up by the unimaged regions, i.e., the regions of the top layer not removed by the development process. The ink is then transferred to a suitable receiving material (such as cloth, paper, metal, glass or plastic) either directly or indirectly through the use of an offset printing blanket to provide a desired impression of the image thereon. The imaging members can be cleaned between impressions, if desired, using conventional cleaning means.

The advantageous properties of this invention can be observed by reference to the following examples, which illustrate but do not limit the invention.

EXAMPLES

| | Glossary |
|---|---|
| 956 Developer | Solvent based (phenoxyethanol) alkaline developer (Kodak Polychrome Graphics, Norwalk, CT, USA) |
| BYK 307 | Polyethoxylated dimethylpolysiloxane copolymer (Byk-Chemie, Wallingford, CT, USA) |
| Copolymer A | Copolymer of N-phenylmaleimide, methacrylamide, and methacrylic acid (45:35:20 mol %) |
| Copolymer C | Copolymer (40:50:10 wt %) of APK-234, acrylonitrile, and methacrylamide. APK-234 is a urea substituted monomer of the following structure: [$CH_2$=C($CH_3$)—$CO_2$—$CH_2CH_2$—NH—CO—NH-p-$C_6H_4$—OH] |

-continued

Glossary

| | |
|---|---|
| Ethyl Violet | C.I. 42600; CAS 2390-59-2 ($\lambda_{max}$ = 596 nm) [(p-$(CH_3CH_2)_2NC_6H_4)_3C^+$ $Cl^-$] |
| FLUORAD ® FC 430 | Nonionic fluoro-surfactant (3M, St. Paul, MN, USA)) |
| Goldstar ™ Developer | Sodium metasilicate based aqueous alkaline developer (Kodak Polychrome Graphics, Norwalk, CT, USA) |
| IR Dye A | Infrared absorbing dye ($\lambda_{max}$ = 830 nm) (Eastman Kodak, Rochester, NY, USA) |
| P3000 | Reaction product of 1,2-naphthaquinone-5-sulfonyl chloride with pyrogallol acetone condensate (PCAS, Longjumeau, France) |
| PD-1 Developer | Aqueous alkaline developer concentrate (Kodak Polychrome Graphics, Norwalk, CT, USA) |
| PD-140A | Cresol/formaldehyde novolac resin (75:25 m-cresol/-p-cresol) (Borden Chemical, Columbus, OH, USA) |
| SP-1077 | Thermoplastic phenolic resin (Schenectady International, Schenectady, NY, USA) |

Example 1

This example illustrates development of an ultraviolet imaged imageable element and an infrared imaged imageable element in the same developer.

An imageable element was prepared as follows:

Underlayer. A coating solution was prepared by dissolving 84.36 parts by weight of Copolymer A, 15.14 parts by weight of IR Dye A, 0.25 part by weight of BYK 307, and 0.25 part by weight of FLUORAD® FC 430 in a mixture of butyrolactone, methyl ethyl ketone, water, and 1-methoxypropan-2-ol (15:20:5:60 by weight). The solution was coated onto a substrate using a whirl coater. The substrate was an aluminum sheet substrate, 0.3 gauge, which had been electrograined, anodized and treated with a solution of polyvinylphosphonic acid. The coated substrate was dried at 100° C. for 90 sec to provide an underlayer with a coating weight of 2.0 g/m².

Top layer. A coating solution of P3000 in 70:30 mixture of toluene and 1-methoxypropan-2-ol was coated on the underlayer layer using a whirl coater and dried at 100° C. for 90 sec to provide a top layer with a coating weight of 0.7 g/m².

Infrared Exposure and Development. The plate precursor was laser imaged using an internal test pattern on Creo Trendsetter thermal exposure device (Creo Products, Burnaby, BC, Canada) having laser diode array emitting at 830 nm and an imaging energy density of 150 mJ/cm².

The imaged precursor was developed in 956 Developer, a solvent based developer. The imaged precursor was hand developed for 60 sec at 25° C., rinsed with water and dried. The laser-imaged regions of the test pattern were removed leaving an accurate copy of the imaging test pattern. The resolution appeared to be at least 2–98% at 150 lines per inch.

An additional imaged precursor was hand developed (60 sec at 25° C.) in Goldstar™ Developer. A accurate copy of the test pattern was made.

Ultraviolet Imaging and Development. The precursor was ultraviolet imaged through an exposure mask with 105 mJ/cm² of light in an Olix A1 131 contact light frame (Olec, Irvine, Calif., USA).

The imaged precursor was developed in PD-1 Developer, an aqueous alkaline developer concentrate, diluted with water (one part concentrate and seven parts of water). The imaged precursor was hand developed for 60 sec at 25° C., rinsed with water and dried. The ultraviolet-imaged regions were removed leaving an accurate copy of the image mask.

An additional precursor was ultraviolet imaged as above. The imaged precursor was hand developed (60 sec at 25° C.) in a 50:50 mixture of PD-1 Developer that had been diluted with water (one part concentrate and seven parts water) and 956 Developer and dried. The ultraviolet-imaged regions were removed leaving an accurate copy of the image mask.

Example 2

An underlayer was prepared by coating a coating solution containing 66.67 parts by weight of Copolymer A, 25.83 parts by weight of Copolymer C, and 7.50 parts by weight of IR Dye A in a mixture of butyrolactone, methyl ethyl ketone, water, and 1-methoxypropan-2-ol (15:20:5:60 by weight) onto the substrate of Example 1 using a whirl coater. The coated substrate was dried at 100° C. for 90 sec to provide an underlayer with a coating weight of 2.0 g/m². The top layer of Example 1 was coated over the underlayer as in Example 1 to provide a top layer with a coating weight of 0.7 g/m².

Samples of the resulting precursor were ultraviolet imaged as in Example 1. One sample was developed in PD-1 Developer diluted with water (one part concentrate and seven parts water), as in Example 1. A second sample developed in a 50:50 mixture of PD-1 Developer that had been diluted with water (one part concentrate and seven parts water) and 956 Developer, as in Example 1. In each case, the ultraviolet-imaged regions were removed leaving an accurate copy of the image mask.

Example 3

This example illustrates development of an ultraviolet imaged imageable element and an infrared imaged imageable element in the same developer.

Imageable Element. An underlayer was prepared by coating a coating solution containing 84.7 parts by weight of Copolymer A, 15.2 parts by weight of IR Dye A, and 0.1 part by weight of BYK 307 in a mixture of butyrolactone, methyl ethyl ketone, water, and 1-methoxypropan-2-ol (15:20:5:60 by weight) onto the substrate of Example 1 using a whirl coater. A coating solution was prepared by dissolving 30.0 parts by weight of P3000, 6.0 parts by weight of SP-1077, 63.0 parts by weight PD140A, 0.4 parts by weight ethyl violet, and 0.6 parts by weight BYK 307 in a 30:70 (by weight) mixture of toluene and 1-methoxypropan-2-ol. The coating solution was coated on the underlayer layer using a whirl coater and dried at 100° C. for 90 sec to provide a top layer with a coating weight of 0.7 g/m$^2$.

Infrared Imaging and Development. The resulting plate precursor was laser imaged using an internal test pattern of the Creo Trendsetter thermal exposure device emitting at 830 nm with an imaging energy density of 117 mJ/cm$^2$.

The imaged precursor was developed in PD-1 Developer diluted with water (one part concentrate and seven parts water). The imaged precursor was hand developed for 20 sec at 25° C., rinsed with water and dried. The laser-imaged regions of the test pattern were removed leaving an accurate copy of the imaging test pattern.

Ultraviolet Imaging and Development. The precursor was ultraviolet imaged through an exposure mask with 200 mJ/cm$^2$ of light in the Olix A1 131 contact light frame.

The imaged precursor was developed in PD-1 Developer diluted with water as above (one part concentrate and seven parts water). The imaged precursor was hand developed for 20 sec at 25° C., rinsed with water and dried. The ultraviolet imaged regions of the test pattern were removed leaving an accurate copy of the imaging test pattern.

Example 4

This example illustrates development of an ultraviolet imaged imageable element and an infrared imaged imageable element in the same developer.

The precursor prepared in Example 3 was imaged with infrared and with ultraviolet described in Example 3. The imaged precursors were developed in a mixed developer. The developer consisted of 8 parts by volume of 956 Developer, 1 part by volume of PD-1 Developer, and 7 parts by volume of water. The infrared imaged precursor was hand developed for 15 sec at 25° C., rinsed with water and dried. The ultraviolet imaged precursor was hand developed for 15 sec at 25° C., rinsed with water and dried.

Dot values from the test patterns were determined using a Gretag D19C densitometer (Gretag MacBeth Color Systems, The Wirral, UK). The results are shown in Table 1.

TABLE 1

| % Dot Values | Measured Dot Values | |
| --- | --- | --- |
| | IR Exposure | UV exposure |
| 2 | —[a] | 2 |
| 5 | —[a] | 5 |
| 7 | —[a] | 8 |
| 10 | 9 | 10 |
| 15 | —[a] | 16 |
| 20 | 19 | 20 |
| 25 | 24 | 25 |
| 30 | 30 | 30 |
| 40 | 40 | —[a] |
| 50 | 50 | 50 |
| 55 | —[a] | 55 |
| 60 | 61 | 62 |
| 65 | —[a] | 67 |
| 70 | 71 | 72 |
| 75 | 76 | 77 |
| 80 | 82 | 82 |

TABLE 1-continued

| % Dot Values | Measured Dot Values | |
| --- | --- | --- |
| | IR Exposure | UV exposure |
| 85 | —[a] | 87 |
| 90 | 92 | 92 |

[a]Dot value not available on the test pattern so a reading could not be made.

Having described the invention, we now claim the following and their equivalents.

What is claimed is:

1. A method for forming an image, the method comprising the steps of:
    (a) imaging an imageable element either thermally or with ultraviolet radiation and producing an imaged imageable element comprising imaged and unimaged regions;
    (b) developing the imaged imageable element with a developer and removing the imaged regions;
    in which:
    the imageable element comprises, in order:
    a top layer;
    an underlayer; and
    a substrate;
    the underlayer comprises a first polymeric material;
    the underlayer is soluble in or removable by the developer;
    the top layer is ink receptive;
    the top layer is insoluble in the developer prior to imaging;
    the top layer comprises a phenolic polymer and a compound that comprises an o-benzoquinonediazide moiety or an o-diazonaphthoquinone moiety; a phenolic polymer that comprises the o-benzoquinonediazide moiety or the o-diazonaphthoquinone moiety; or a mixture thereof; and
    the developer is an about 20:80 to about 80:20 mixture of:
    (1) an aqueous alkaline developer that has a pH greater than 11 and comprises about 2 wt % to about 8 wt % of an alkali metal silicate, based on the weight of the aqueous alkaline developer, and
    (2) a solvent based developer that comprises about 0.5 wt % to about 15 wt % of an organic solvent or mixture of organic solvents, based on the weight of the solvent based developer.

2. The method of claim 1 in which imaging is carried out with ultraviolet radiation.

3. The method of claim 1 in which imaging is carried out thermally.

4. The method of claim 1 in which the imageable element additionally comprises a photothermal conversion material.

5. The method of claim 4 in which the solvent based developer comprises about 3 wt % to about 5 wt % of the organic solvent or mixture of organic solvents, based on the weight of the solvent based developer; and the aqueous alkaline developer has a pH between about 12 and about 14.

6. The method of claim 5 in which the aqueous alkaline developer comprises about 4 wt % to about 6.5 wt % of the alkali metal silicate, based on the weight of the aqueous alkaline developer; and the alkali metal silicate has a SiO$_2$ to M$_2$O weight ratio of at least of about 0.3 to about 1.2, in which M is the alkali metal.

7. The method of claim 6 in which imaging is carded out with ultraviolet radiation.

8. The method of claim 6 in which imaging is carried out with infrared radiation.

9. The method of claim 4 in which the developer is an about 40:60 to about 60:40 mixture of the aqueous alkaline developer and the solvent based developer.

10. The method of claim 9 in which the solvent based developer comprises about 3 wt % to about 5 wt % of the organic solvent or mixture of organic solvents, based on the weight of the solvent based developer; the aqueous alkaline developer has a pH between about 12 and about 14; the aqueous alkaline developer comprises about 4 wt % to about 6.5 wt % of the alkali metal silicate, based on the weight of the aqueous alkaline developer; and the alkali metal silicate has a $SiO_2$ to $M_2O$ weight ratio of at least of about 0.3 to about 1.2, in which M is the alkali metal.

11. The method of claim 10 in which the developer is an about 50:50 mixture of the solvent based developer and the aqueous alkaline developer.

12. The method of claim 10 in which the underlayer comprises the photothermal conversion material, and the top layer is substantially free of the photothermal conversion material.

13. The method of claim 10 in which the phenolic polymer is a novolac resin, the compound that comprises an o-benzoquinonediazide moiety or an o-diazonaphthoquinone moiety comprises the o-diazonaphthoquinone moiety; and the phenolic polymer that comprises the o-benzoquinonediazide moiety or the o-diazonaphthoquinone moiety is a novolac resin that comprises the o-diazonaphthoquinone moiety.

14. The method of claim 1 in which the phenolic polymer is a novolac resin, the compound that comprises an o-benzoquinonediazide moiety or an o-diazonaphthoquinone moiety comprises the o-diazonaphthoquinone moiety; and the phenolic polymer that comprises the o-benzoquinonediazide moiety or the o-diazonaphthoquinone moiety is a novolac resin that comprises the o-diazonaphthoquinone moiety.

15. The method of claim 14 in which the solvent based developer comprises about 3 wt % to about 5 wt % of the organic solvent or mixture of organic solvents, based on the weight of the solvent based developer; the aqueous alkaline developer has a pH between about 12 and about 14; the aqueous alkaline developer comprises about 4 wt % to about 6.5 wt % of the alkali metal silicate, based on the weight of the aqueous alkaline developer; and the alkali metal silicate has a $SiO_2$ to $M_2O$ weight ratio of at least of about 0.3 to about 1.2, in which M is the alkali metal.

16. The method of claim 14 in which the imageable element additionally comprises a photothermal conversion material.

17. The method of claim 16 in which the solvent based developer comprises 3 wt % and about 5 wt % of the organic solvent or mixture of organic solvents, based on the weight of the solvent based developer; the aqueous alkaline developer has a pH between about 12 and about 14; the aqueous alkaline developer comprises about 4 wt % to about 6.5 wt % of the alkali metal silicate, based on the weight of the aqueous alkaline developer; and the alkali metal silicate has a $SiO_2$ to $M_2O$ weight ratio of at least of about 0.3 to about 1.2, in which M is the alkali metal.

18. The method of claim 17 in which the developer is an about 40:60 to about 60:40 mixture of the aqueous alkaline developer and the solvent based developer.

19. The method of claim 18 in which imaging is carried out with ultraviolet radiation.

20. The method of claim 18 in which imaging is carried out with infrared radiation.

21. A method comprising the steps of:
(a) thermally imaging a first imageable element and forming a first imaged imageable element, and developing the first imaged imageable element in a first developer and producing a first image; and
(b) imaging a second imageable element with ultraviolet radiation and forming a second imaged imageable element, and developing the second imaged imageable element in a second developer and producing a second image;

in which:
either step (a) or step (b) may be carried out first;
the first imageable element and second imageable each comprises, in order:
a top layer;
an underlayer; and
a substrate;
the underlayer comprises a first polymeric material;
the underlayer is soluble in or removable by the developer;
the top layer is ink receptive;
the top layer is insoluble in the developer prior to imaging;
the top layer comprises a phenolic polymer and a compound that comprises an o-benzoquinonediazide moiety or an o-diazonaphthoquinone moiety; a phenolic polymer that comprises the o-benzoquinonediazide moiety or the o-diazonaphthoquinone moiety; or a mixture thereof;
the first developer and the second developer have the same composition, and
the first developer and the second developer are each an about 20:80 to about 80:20 mixture of:
(1) an aqueous alkaline developer that has a pH greater than 11 and comprises about 2 wt % to about 8 wt % of an alkali metal silicate, based on the weight of the aqueous alkaline developer, and
(2) a solvent based developer that comprises about 0.5 wt % to about 15 wt % of an organic solvent or mixture of organic solvents, based on the weight of the solvent based developer.

22. The method of claim 21 in which the imageable element comprises a photothermal conversion material, and thermal imaging is carried out with infrared radiation.

23. The method of claim 22 in which the solvent based developer comprises about 3 wt % to about 5 wt % of the organic solvent or mixture of organic solvents, based on the weight of the solvent based developer; and the aqueous alkaline developer has a pH between about 12 and about 14.

24. The method of claim 23 in which the aqueous alkaline developer comprises about 4 wt % to about 6.5 wt % of the alkali metal silicate, based on the weight aqueous alkaline developer; and the alkali metal silicate has a $SiO_2$ to $M_2O$ weight ratio of at least of about 0.3 to about 1.2, in which M is the alkali metal.

25. The method of claim 24 in which the developer is an about 40:60 to about 60:40 mixture of the aqueous alkaline developer and the solvent based developer.

26. The method of claim 25 in which the phenolic polymer is a novolac resin, the compound that comprises an o-benzoquinonediazide moiety or an o-diazonaphthoquinone moiety comprises the o-diazonaphthoquinone moiety; and the phenolic polymer that comprises the o-benzoquinonediazide moiety or the o-diazonaphthoquinone moiety is a novolac resin that comprises the o-diazonaphthoquinone moiety.

27. The method of claim 26 in which the underlayer comprises the photothermal conversion material and the top layer is substantially free of photothermal conversion material.

28. The method of claim 21 in which the phenolic polymer is a novolac resin, the compound that comprises an o-benzoquinonediazide moiety or an o-diazonaphthoquinone moiety comprises the o-diazonaphthoquinone moiety; and the phenolic polymer that comprises the o-benzoquinonediazide moiety or the o-diazonaphthoquinone moiety is a novolac resin that comprises the o-diazonaphthoquinone moiety.

29. The method of claim 28 in which the underlayer comprises the photothermal conversion material and the top layer is substantially free of photothermal conversion material.

* * * * *

UNITED STATES PATENT AND TRADEMARK OFFICE
CERTIFICATE OF CORRECTION

PATENT NO. : 6,803,167 B2
DATED : October 12, 2004
INVENTOR(S) : Jayanti Patel, Kevin B. Ray and Jianbing Huang It is certified that error appears in the above-identified patent and that said Letters Patent is hereby corrected as shown below:

Title page,
Item [73], Assignee, delete "Norwalk (CN)" and insert -- Norwalk, (CT) --

Column 19,
Line 1, delete "carded" and insert -- carried --

Column 20,
Line 19, delete "comprises" and insert -- element comprises --

Signed and Sealed this

Twelfth Day of April, 2005

JON W. DUDAS
*Director of the United States Patent and Trademark Office*